United States Patent [19]

Narang et al.

[11] Patent Number: 4,663,269

[45] Date of Patent: May 5, 1987

[54] METHOD OF FORMING HIGHLY SENSITIVE PHOTORESIST FILM IN THE ABSENCE OF WATER

[75] Inventors: Subhash C. Narang, Menlo Park, Calif.; Shabbir Attarwala, Jackson Heights, N.Y.

[73] Assignee: Polytechnic Institute of New York, New York, N.Y.

[21] Appl. No.: 763,371

[22] Filed: Aug. 7, 1985

[51] Int. Cl.$^4$ ................................................. G03C 5/16
[52] U.S. Cl. ..................................... 430/326; 430/270; 430/330
[58] Field of Search ..................... 430/330, 326, 270

[56] References Cited

U.S. PATENT DOCUMENTS

| | | | |
|---|---|---|---|
| 3,620,734 | 11/1971 | Cerwonka | 96/35.1 |
| 3,915,704 | 10/1975 | Limburg et al. | 96/27 |
| 3,915,706 | 10/1975 | Limburg et al. | 96/27 |
| 3,917,483 | 11/1975 | Limburg et al. | 96/27 |
| 3,923,514 | 12/1975 | Marsh | 96/35 |
| 3,961,099 | 6/1976 | Gipstein et al. | 430/326 X |
| 4,136,102 | 1/1979 | Crivello | 430/270 X |
| 4,247,611 | 1/1981 | Sander et al. | 430/286 |
| 4,248,957 | 2/1981 | Sander et al. | 430/270 |
| 4,250,247 | 2/1981 | Sander et al. | 430/270 |
| 4,307,177 | 12/1981 | Crivello | 430/270 |
| 4,368,253 | 1/1983 | Green et al. | 430/326 |
| 4,371,691 | 2/1983 | Friedhofen et al. | |
| 4,398,014 | 8/1983 | Green et al. | 528/196 |
| 4,435,496 | 3/1984 | Walls et al. | 430/285 |
| 4,491,628 | 1/1985 | Ito et al. | 430/326 X |
| 4,552,833 | 11/1985 | Ito et al. | 430/270 X |

FOREIGN PATENT DOCUMENTS 1330100 1/1983 United Kingdom .

OTHER PUBLICATIONS

N. J. Clecak, H. Ito and C. G. Willson, "U V Hardening of Resist Images", *IBM Technical Disclosure Bulletin*, vol. 27, No. 1A, Jun. 1984, p. 162.

Willson et al., "Introduction to Microlithography", p. 152, et seq., *American Chemical Society*, (1983).

*Primary Examiner*—John E. Kittle
*Assistant Examiner*—Cynthia Hamilton
*Attorney, Agent, or Firm*—David H. Semmes; Warren E. Olsen

[57] ABSTRACT

Method of forming highly sensitive, high resolution positive photoresist compositions that are developed from polycarbonates derived from t-diols and various diphenols and homopolycarbonates from t-diols, mixed with 2–10% of onium salts wtih complex metal halide counterions. The high sensitivity of the photoresist compositions is due to the thermodynamic stabilities of the resulting incipient dicarbocations and dienes.

5 Claims, No Drawings

METHOD OF FORMING HIGHLY SENSITIVE PHOTORESIST FILM IN THE ABSENCE OF WATER

BACKGROUND OF THE INVENTION

1. Field of the Invention:

Photoresist compositions, particularly a positive photoresist of high sensitivity and high resolution that is applied as film to substrates or microchips.

2. The Prior Art:

Polycarbonate photoresist materials are known. The prior art also discloses generation of strong protic acid by photolysis of onium salts. CRIVELLO et al. (U.S. Pat. Nos. 136,102; 4,307,177) have previously reported the photodecomposition of polycarbonate in the presence of onium salts and water. The present invention works in the absence of water and represents the main chain analog of WILLSON et al.'s pendant-group carbonate photoresist. (See WILLSON et al. "Indroduction to Microlithography," page 152 et. seq., *American Chemical Society*, (1983)). Water is detrimental to the sensitivity of photoresists.

The prior art, also, discloses polycarbonate positive electron beam resists. However, the present positive resists have the advantage of higher sensitivity to the ultraviolet and visible radiations, and lesser sensitivity to oxygen and other singlet or triplet quenchers. Such resists have good potential for imaging in the fabrication of microelectronic devices, printing plates, and the like.

Additional prior art references are being submitted separately in an Information Disclosure Statement.

SUMMARY OF THE INVENTION

The present invention is concerned with positive photoresists. More specifically, it is concerned with photoresists that are made of polycarbonates derived from t-diols and various phenols mixed with 2-10 weight percent of onium salts with complex metal halide counterions. Photolysis of onium salts with complex metal halide counterions generates protic acid and Lewis acids that cause depolymerization of the polycarbonate. The high sensitivity of these resists to produce positive images is due to the thermodynamic stabilities of the resulting incipient dicarbocation and dienes.

DESCRIPTION OF THE PREFERRED EMBODIMENTS

In the present invention, a thin film of polycarbonate derived from tertiary diols and various diphenols mixed with 2-10 weight percent of onium salts with complex metal halide counterions is applied to a substrate and the portion of the layer to be removed is exposed to ultraviolet or visible radiation. Exposure results in the decomposition of the onium salts, so as to generate strong protic acid in the film. The films are then baked at 100°-140° C. in air for 30-100 sec. The baking process results in the acid-catalyzed thermal decomposition of the polycarbonate to the corresponding diene and bisphenol. Carbon dioxide is a by-product in this reaction. The post-baked films are developed in organic solvents, for example, hexane-ether, to dissolve non-volatile material remaining (if any) in the exposed area, to yield a high resolution positive tone image.

The polycarbonates useful in the process of the present invention are materials having the formula:

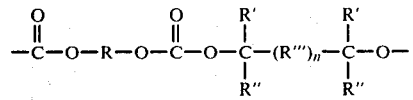

where R, R', R'' may be aryl, alkyl, or aryl alkyl. R''' may be aryl, (CH$_2$)n, or aryl alkyl.

These polycarbonates are synthesized by solution condensation polymerization of the desired bis chloroformate ester and tertiary diols in the presence of an organic base to neutralize the hydrochloric acid formed during the polymerization process. A few of the desired polycarbonates are also synthesized by interfacial condensation polymerization.

The sensitivity of the resists in the present invention is dependent upon the structure of tertiary diols and the onium salts. Tertiary diols containing α-phenyl groups provide higher sensitivity. However, the presence of at least one α-methyl or α-methylene group is obviously necessary for proton elimination.

The sensitivity of the polycarbonate resists of the present invention is 30-70 mJ/cm$^2$.

The onium salts have a significant effect on the sensitivity of polycarbonate resists. The sulfonium salts provide higher sensitivities than the iodonium salts. The order of sensitivity of the complex metal halide conterion is $SbF_6^- > AsF_6^- > PF_6^- > BF_4^-$. In the present invention, by varying the structure of onium salts and using sensitizers known to the prior art, it is possible to use these polycarbonates as positive photoresists both in deep-UV to mid-UV and visible-radiation photolithography.

Post-baking is necessary to effect acid catalyzed thermal decomposition of polycarbonate. Baking is done at a temperature below the glass transition temperature of the polymer, in the presence of air, or in a vacuum, to obtain high resolution images. Depending upon the structure of the polycarbonate and the degraded product, the image gets partially or completely developed during the post-baking process.

Solvent development is carried out preferably at room temperature. The optimum development time is determined for each case by the factors of exposure, dosage, post-baking time and temperature, film thickness, solvent system, and solvent temperature as known by one skilled in the art.

The patterned resist in this invention has high resolution of less than the film thickness, for example, 1.0μ-1.2μ image line and space in a film thickness of 2.0μ.

The following examples are given for the purpose of illustration and are not to be considered a limitation on the invention many variations of which are possible without departing from the spirit and scope thereof.

EXAMPLE 1

Positive patterns were generated by exposing thin films of a composition containing a polycarbonate and an onium salt with complex metal halide counterions. Illustrative degradation is shown below.

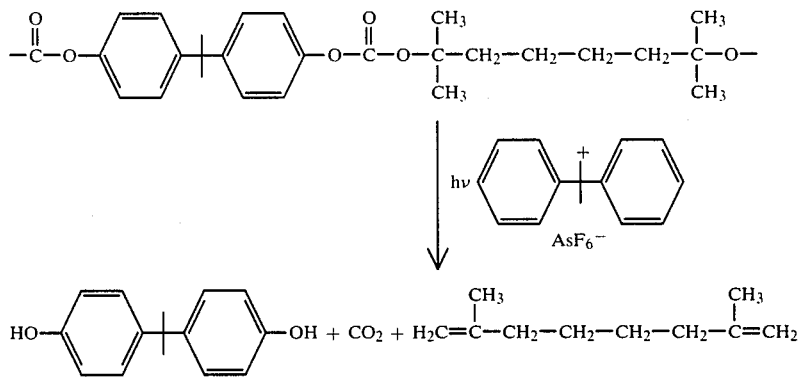

The strong acid $HMX_n$ generated on photolysis of the iodonium salt catalyzes the decomposition of the polycarbonate. Post-baking at 100° for one minute was required for development of the latent image. The positive image was developed in hexane-ether.

The photoinitiators used may include diaryliodonium salts, triarylsulfonium salts, diaryalkylsulfonium salts, phenacylsulfonium salts and aryldiazonium salts with complex metal halide counterions.

High resolution images were developed on exposure for 1-2 seconds to UV, followed by post-baking at 100°-135° for one minute and development in hexane-ether.

EXAMPLE 2

High resolution images were generated by exposing a thick film of polycarbonate, made from 2,5-dimethyl-2,5-hexanediol and bischloroformate ester of 4,4'-isopropylidenediphenol, mixed with 2-5% by weight of triphenyl sulfonium hexafluoro arsenate salt, to deep UV radiation for 15 seconds followed by post-baking at 110°-120° for 60 seconds and development in alcoholic solvents.

It is respectfully submitted that the present photoresist composition is superior to conventional photoresist because of high chemical amplification that is achieved as a result of the catalytic nature of the reaction. The reaction is completed in the absence of water and a large number of chemical steps are eliminated as opposed to resists that work on the basis of polarity change.

I claim:

1. A method of forming positive images with high sensitivity and high resolution in the absence of water on a substrate comprising:
   (a) forming on the substrate a photoresist film comprising 2-10% by weight of onium salts and a polycarbonate, as follows:

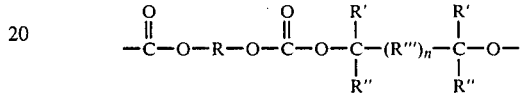

where R, R', R″ = aryl, alkyl, arylalkyl, R‴ = aryl, $(CH_2)n$ and aralkyl;

(b) exposing the film to radiation; and
(c) removing the radiation exposed portion of said film with an organic solvent or aqueous alkali solution.

2. A method of forming positive images with high sensitivity and high resolution as in claim 1, wherein the onium salt is a catalyst for the degradation of the polycarbonate.

3. A method of forming positive images with high sensitivity and high resolution as in claim 2, including applying the photoresist composition as a thin film upon a substrate prior to said photolyzing, then post-baking at a temperature below the glass transition temperature of the polymer, so as to effect acid catalyzed thermal decomposition of the polycarbonate.

4. A method of forming positive images with high sensitivity and high resolution comprising:
   a. photolyzing a thin film of photoresist composition consisting of:
      i. a polycarbonate, as follows:

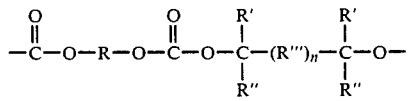

where R, R', R″ = aryl, alkyl, arylalkyl, R‴ = aryl, $(CH_2)n$ and aralkyl;
      ii. a catalyst onium salt, and;
      iii. complex metal halide counterions;
   b. post-baking at a temperature below the glass transition temperature of the polymer so as to effect acid catalyzed thermal decomposition of said polycarbonate; and
   c. developing the photolyzed composition in an organic solvent.

5. A method of forming positive images with high sensitivity and high resolution as in claim 3, wherein said applying of photoresist composition is as a film with a thickness of 2.0 microns.

* * * * *